(12) United States Patent
Ryu et al.

(10) Patent No.: US 7,659,543 B2
(45) Date of Patent: Feb. 9, 2010

(54) ORGANIC LIGHT EMITTING DISPLAY AND METHOD OF FABRICATING THE SAME

(75) Inventors: Seoung-Yoon Ryu, Suwon-si (KR); Ja-Hyun Im, Suwon-si (KR); Kwan-Hee Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 471 days.

(21) Appl. No.: 11/274,209

(22) Filed: Nov. 16, 2005

(65) Prior Publication Data
US 2006/0102911 A1    May 18, 2006

(30) Foreign Application Priority Data
Nov. 17, 2004    (KR) ............... 10-2004-0094357

(51) Int. Cl.
*H01L 51/54* (2006.01)
*H01J 1/62* (2006.01)
*H01L 29/20* (2006.01)
*B05D 5/12* (2006.01)

(52) U.S. Cl. ............... 257/88; 428/690; 428/917; 313/504; 313/506; 427/66

(58) Field of Classification Search ............... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | | |
|---|---|---|---|---|
| 6,559,594 B2* | 5/2003 | Fukunaga et al. | ........... | 313/506 |
| 6,803,123 B2* | 10/2004 | Wang et al. | ........... | 428/690 |
| 2002/0149315 A1* | 10/2002 | Blanchet-Fincher | ........ | 313/504 |
| 2003/0197467 A1* | 10/2003 | Adachi et al. | ............... | 313/504 |
| 2004/0004433 A1* | 1/2004 | Lamansky et al. | ........... | 313/506 |

OTHER PUBLICATIONS

Qiu et al, "Dependence of the current and power efficiencies of organic light-emitting diode on the thickness of the constituent organic layers," IEEE Transaction on Electron Devices, vol. 48, No. 9, pp. 2131-2137, Sep. 2001.*

Vestweber, et al., "Highly efficient and stable organic light-emitting diodes," Synthetic Metals, vol. 91, No. 1-3, pp. 181-185, Dec. 1997.*

\* cited by examiner

*Primary Examiner*—D. Lawrence Tarazano
*Assistant Examiner*—Camie S Thompson
(74) *Attorney, Agent, or Firm*—H.C. Park & Associates, PLC

(57) ABSTRACT

An organic light emitting display including a pixel electrode arranged on a substrate, an organic layer arranged on the pixel electrode and including at least a hole injection layer, a hole acceleration layer, a hole transport layer, and an emission layer, and an opposite electrode arranged on the organic layer. The hole acceleration layer is formed of a material having a hole mobility that is higher than that of the hole injection layer.

14 Claims, 2 Drawing Sheets

US 7,659,543 B2

ORGANIC LIGHT EMITTING DISPLAY AND METHOD OF FABRICATING THE SAME

CROSS-REFERENCE TO RELATED APPLICATION

This application claims priority to and the benefit of Korean Patent Application No. 10-2004-0094357, filed Nov. 17, 2004, which is hereby incorporated by reference for all purposes as if fully set forth herein.

BACKGROUND OF THE INVENTION

1. Field of the Invention

The present invention relates to an organic light emitting display (OLED) and method of fabricating the same and, more particularly, to an OLED including a hole acceleration layer between a hole injection layer and a hole transport layer.

2. Discussion of the Background

Generally, an OLED is a thin, lightweight self-emissive display device that has simple components and may be fabricated using a simple process. Also, the OLED may have high resolution and a wide viewing angle, which enables high quality moving images and color purity. Further, since the OLED may operate at low power and voltage, it is appropriate for mobile devices.

In a conventional OLED structure, a pixel electrode is arranged on a substrate, an organic layer including an emission layer (EML) is arranged on the pixel electrode, and an opposite electrode is arranged on the organic layer. The organic layer may further include a hole injection layer (HIL) and a hole transport layer (HTL) between the pixel electrode and the EML, and it may also include an electron transport layer (ETL) and an electron injection layer (EIL) between the EML and the opposite electrode.

An OLED as described above operates on the following principle. Applying a voltage between the pixel electrode and the opposite electrode injects holes from the pixel electrode through the HIL and HTL into the EML, and injects electrons from the opposite electrode through the EIL and ETL into the EML. The holes and electrons then recombine in the EML to generate excitons, which emit light while transitioning from an excited state to a ground state.

Generally, since a top-emitting OLED utilizes optical resonance, the pixel electrode, the HIL, and the HTL are typically formed to a thickness that is equivalent to a wavelength range. The HIL facilitates hole injection from the pixel electrode when it is an anode, thereby improving power consumption efficiency and the OLED's life span. Also, the HTL, which has high hole mobility, allows holes to be easily transported and binds electrons in an emission region so as to increase the likelihood of generating excitons. In order to realize National Television System Committee (NTSC) chromaticity coordinates, the OLED typically includes an HIL and an HTL, each of which has an appropriate thickness. However, if the HIL and HTL are formed to the appropriate thickness, a driving voltage is increased due to the HIL's relatively low hole mobility, thus resulting in high power consumption.

SUMMARY OF THE INVENTION

The present invention provides an OLED, and method of fabricating the same, in which a hole acceleration layer, which has a higher hole mobility than an HIL, is interposed between the HIL and an HTL to enhance luminance for the same chromaticity coordinates and reduce power consumption.

Additional features of the invention will be set forth in the description which follows, and in part will be apparent from the description, or may be learned by practice of the invention.

The present invention discloses an OLED including a first electrode arranged on a substrate, an organic layer arranged on the first electrode and having at least an HIL, an HAL, an HTL, and an EML, and a second electrode arranged on the organic layer. A hole mobility of a material forming the hole acceleration layer is higher than a hole mobility of a material forming the hole injection layer.

The present invention also discloses a method of fabricating an OLED including forming a first electrode on a substrate, forming an organic layer on an emission region of the first electrode, and forming a second electrode on the organic layer. The organic layer includes at least an HIL, an HAL, an HTL, and an EML, and a hole mobility of a material forming the hole acceleration layer is higher than a hole mobility of a material forming the hole injection layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
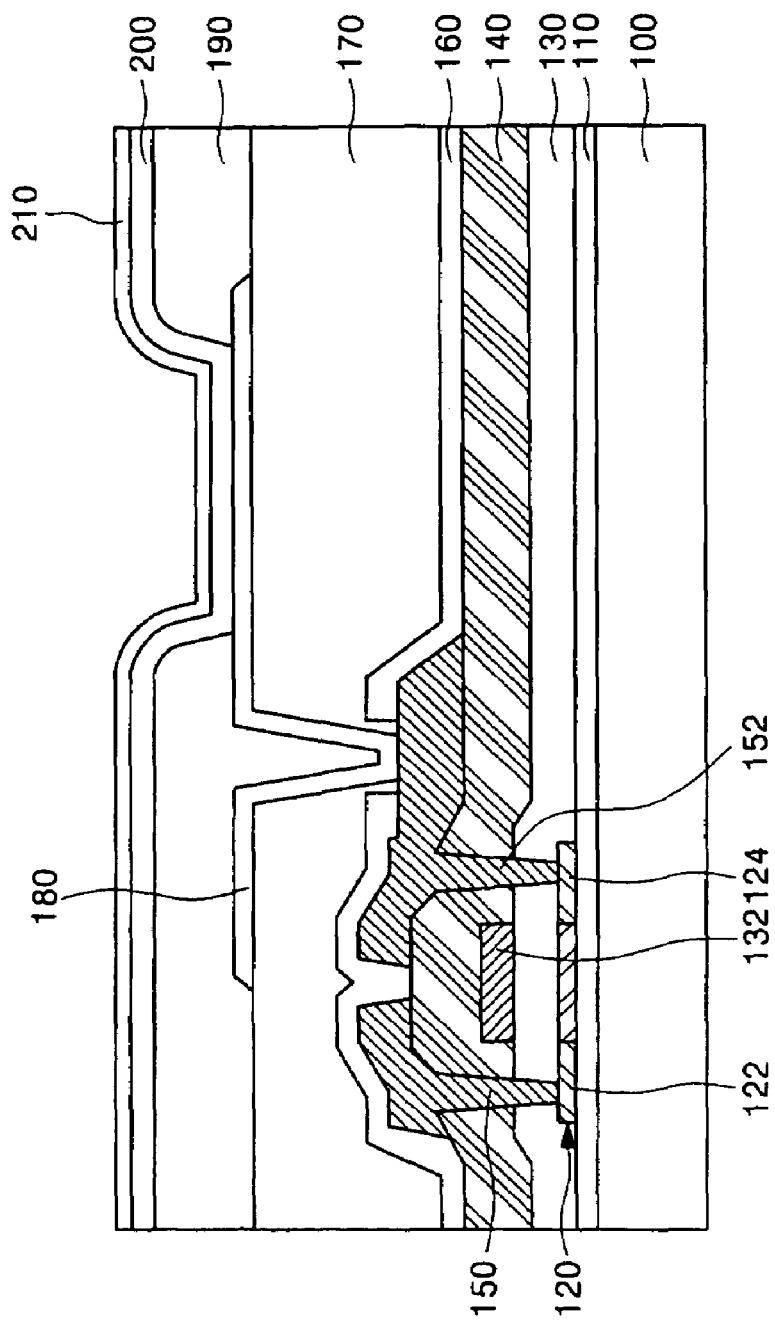
FIG. 1 is a schematic cross-sectional view of an OLED according to an exemplary embodiment of the present invention.

Hereinafter, exemplary embodiments of the present invention will be described with reference to the accompanying drawings. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Here, when one element is connected to another element, one element may be not only directly connected to another element but also indirectly connected to another element via another element. Further, irrelative elements are omitted for clarity. Also, like reference numerals refer to like elements throughout.

Figure 2:
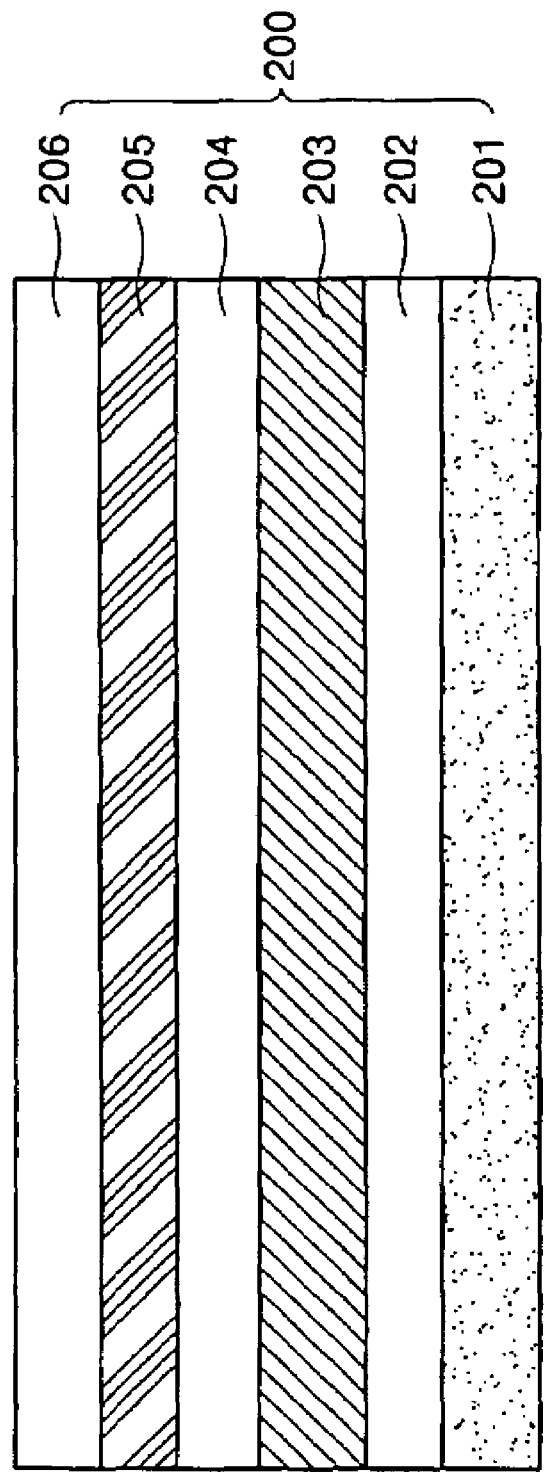
FIG. 2 is a schematic cross-sectional view of the organic layer of FIG. 1.

FIG. 1 is a schematic cross-sectional view of an OLED according to an exemplary embodiment of the present invention, and FIG. 2 is a schematic cross-sectional view of the organic layer of FIG. 1.

Referring to FIG. 1, the OLED includes a substrate 100, a buffer layer 110, a thin-film transistor (TFT), a pixel electrode 180, an organic layer 200 arranged on the pixel electrode 180, and an opposite electrode 210 arranged on the organic layer 200. The TFT includes a gate insulating layer 130, a gate electrode 132, an interlayer insulating layer 140, a source electrode 150, a drain electrode 152 and a passivation layer 160. The source electrode 150 and the drain electrode 152 are connected to a source region 122 and a drain region 124 of a semiconductor layer 120, respectively. The pixel electrode 180 formed on a planarization layer 170 may be connected to either the source or drain electrode 150 or 152. A pixel define layer 190 is formed on an edge of the pixel electrode 180. The organic layer 200 includes at least an HIL, a hole acceleration layer (HAL), an HTL, and an EML. In this case, the OLED may be a top emitting, bottom emitting, or double-sided emitting OLED. For example, if the OLED is a top emitting OLED, the pixel electrode 180 may be a reflective electrode, and the opposite electrode 210 may be a transparent electrode.

Referring to FIG. 2, the organic layer 200 includes at least an HIL 201, an HAL 202, an HTL 203, and an EML 204. It may further include an electron transport layer (ETL) 205 and an electron injection layer (EIL) 206. By interposing the HAL 202 between the HIL 201 and the HTL 203, charges may be balanced between holes and electrons, the optical thickness of the OLED may be adjusted, and power consumption may be reduced.

The HAL 202 may be formed of a material that is used for the HIL but has a higher hole mobility than the HIL 201. When a breakdown voltage ranges from 0.05 to 0.5 MV/cm$^2$, the HAL 202 may be formed of a material having a hole mobility that is higher than $5.1 \times 10^{-4}$ cm$^2$/Vs.

For example, the HAL 202 may be formed of Copper phthalocyanine (CuPc), tris(4-bromophenyl)aminium hexacholroantimonate (TBAHA), tetra(fluoro)-tetra(cyano)quinodimethane (TF-TCNQ), a-sexithiophene (a-6T), N,N'bis(m-tolyl)-1,1'-biphenyl-4,4'-diamine (TPD), 4,4'4"-tris(N,N-diphenylamino)triphenylamine (TDATA), poly(3,4-ethylenedioxythiophene)-poly(styrene) (PEDOT).

Also, although the HIL 201, the HAL 202, and the HTL 203 may have different thickness from each other, the sum of their thicknesses may be in a range of about 1,300 Å to about 2,300 Å. If the sum of their thicknesses is outside this range, charges between holes and electrons may not be balanced.

Hereinafter, an exemplary embodiment of the present invention will be described to facilitate understanding of the invention. However, the present invention is not limited to the following exemplary embodiment.

Embodiment 1

To fabricate an OLED, a pixel electrode was patterned using indium tin oxide (ITO) on a substrate such that a pixel region was defined. An HIL A, an HAL B, an HTL C, and an EML were formed on the pixel region of the pixel electrode, and then at least one thin layer of a hole blocking layer, an ETL, and an EIL was formed. An opposite electrode was deposited, and the resultant structure was encapsulated using a moisture absorbent material and a glass cover. In this case, the HIL A, the HAL B, the HTL C, the EML, the hole blocking layer, the ETL, and the EIL may be formed by, for example, a laser induced thermal imaging method, a lithography method, or an inkjet method.

The HIL A was formed of about 400 Å thick CuPc, the HAL B was formed of about 600 Å thick TPD, and the HTL C was formed of about 400 Å thick (N,N'-bis(1-naphthyl)-N, N'-diphenyl-1,1'-biphenyl-4,4'-diamine) (NPB).

COMPARATIVE EXAMPLE 1

To fabricate an OLED, a pixel electrode was patterned using ITO on a substrate such that a pixel region was defined. An HIL A, an HTL C, and an EML were formed on the pixel region of the pixel electrode, at least one thin layer of a hole blocking layer, an ETL and an EIL was formed, and an opposite electrode was then deposited. The resultant structure was then encapsulated using a moisture absorbent material and an encapsulation substrate.

The HIL A was formed of about 1000 Å thick CuPc, and the HTL C was formed of about 400 Å thick NPB.

COMPARATIVE EXAMPLE 2

An OLED was formed in the same manner as Comparative example 1 except that the HAL of Embodiment 1 was used as an HIL B.

Table 1 shows the luminance, luminous efficiency, chromaticity coordinates, and power consumption measured from the OLEDs fabricated according to Embodiment 1 and Comparative examples 1 and 2. Table 1 shows values of chromaticity coordinates of blue light.

TABLE 1

|  | HIL | HAL | HTL | Luminance (Cd/m$^2$), 6 V | Luminous efficiency (Cd/W), 6 V | Chromaticity coordinates (Blue) NTSC (0.14, 0.07) | Power consumption (mW) |
|---|---|---|---|---|---|---|---|
| Embodiment 1 | A | B | C | 276.9 | 0.69483 | 0.1486, 0.0349 | 361.2 |
| Comparative example 1 | A | — | C | 24.55 | 0.7153 | 0.1458, 0.0398 | 511.8 |
| Comparative example 2 | B | — | C | 84.5 | 0.75503 | 0.1447, 0.0433 | 456.8 |

Referring to Table 1, when the HAL was formed between the HIL and the HTL in Embodiment 1, luminance was about 3 to 12 times as high as, and power consumption was about 1.26 to 1.42 times less than that of, the OLEDs of Comparative examples 1 and 2. Also, in Embodiment 1 and Comparative examples 1 and 2, the chromaticity coordinates approximated the NTSC standard. However, as values of chromaticity coordinates approach the NTSC standard, driving voltage decreases so that lower power consumption may be expected.

Further, compared with Comparative examples 1 and 2, the OLED of Embodiment 1 included the HAL so that the thickness of the HIL, which has a relatively low hole mobility, was reduced as much as 600 Å. Thus, power consumption may be reduced, and an organic layer may be formed between the pixel electrode and the EML with smaller errors.

In exemplary embodiments of the present invention, when an OLED is fabricated, a hole acceleration layer is interposed between an HIL and an HTL using a material having a mobility that is higher than that of the HIL. Consequently, an organic layer may be made thinner without degrading luminous efficiency and chromaticity coordinates, the luminance of the OLED may improve, and power consumption may be reduced.

While exemplary embodiments of the present invention are shown and described in relation to an active matrix display device, the organic layer of the present invention may be utilized in a passive matrix display device or in any other device that utilizes an organic light emitting layer.

It will be apparent to those skilled in the art that various modifications and variation can be made in the present invention without departing from the spirit or scope of the invention. Thus, it is intended that the present invention cover the modifications and variations 1 of this invention provided they come within the scope of the appended claims and their equivalents.

What is claimed is:

1. An organic light emitting display, comprising:
   a first electrode arranged on a substrate;
   an organic layer arranged on the first electrode and comprising at least a hole injection layer, a hole acceleration layer, a hole transport layer, and an emission layer; and
   a second electrode arranged on the organic layer,
   wherein a hole mobility of a material comprising the hole acceleration layer is higher than a hole mobility of a material comprising the hole injection layer,
   wherein the hole mobility of the material comprising the hole acceleration layer is higher than $5.1 \times 10^{-4}$ cm$^2$/Vs,
   wherein the hole acceleration layer comprises one material selected from the group consisting of CuPc, TBAHA, TF-TCNQ, a-6T, and PEDOT,
   wherein the hole injection layer comprises one material selected from the group consisting of CuPc, TBAHA, TF-TCNQ, a-6T, TPD, TDATA, and PEDOT, and
   wherein the hole acceleration layer is arranged between the hole injection layer and the hole transport layer.

2. The display of claim 1, further comprising:
   a thin-film transistor electrically connected to the first electrode.

3. The display of claim 1, wherein the first electrode is a reflective electrode, and the second electrode is a transparent electrode.

4. The display of claim 1, wherein the hole mobility of the material comprising the hole injection layer is in a range of $5.1 \times 10^{-4}$ to $1.7 \times 10^{3}$ cm$^2$/Vs.

5. The display of claim 1, wherein a sum of thicknesses of the hole injection layer, the hole acceleration layer, and the hole transport layer is in a range of 1,300 Å to 2,300 Å.

6. The display of claim 1, wherein the organic layer further comprises at least one of a hole blocking layer, an electron transport layer, and an electron injection layer.

7. The display of claim 1, wherein the hole acceleration layer is arranged on the hole injection layer, and the hole transport layer is arranged on the hole acceleration layer.

8. A method of fabricating an organic light emitting display, comprising:
   forming a first electrode on a substrate;
   forming an organic layer on an emission region of the first electrode, the organic layer comprising at least a hole injection layer, a hole acceleration layer, a hole transport layer, and an emission layer; and
   forming a second electrode on the organic layer,
   wherein a hole mobility of a material comprising the hole acceleration layer is higher than a hole mobility of a material comprising the hole injection layer,
   wherein the hole mobility of the material comprising the hole acceleration layer is higher than $5.1 \times 10^{-4}$ cm$^2$/Vs,
   wherein the hole acceleration layer comprises one material selected from the group consisting of CuPc, TBAHA, TF-TCNQ, a-6T, and PEDOT, and
   wherein the hole injection layer comprises one material selected from the group consisting of CuPc, TBAHA, TF-TCNQ, a-6T, TPD, TDATA, and PEDOT, and
   wherein the hole acceleration layer is arranged between the hole injection layer and the hole transport layer.

9. The method of claim 8, further comprising:
   forming a thin-film transistor that is electrically connected to the first electrode.

10. The method of claim 8, wherein the first electrode is a reflective electrode, and the second electrode is a transparent electrode.

11. The method of claim 8, wherein the hole mobility of the material comprising the hole injection layer is in a range of $5.1 \times 10^{-4}$ to $1.7 \times 10^{3}$ cm$^2$/Vs.

12. The method of claim 8, wherein a sum of thicknesses of the hole injection layer, the hole acceleration layer, and the hole transport layer is in a range of 1,300 Å to 2,300 Å.

13. The method of claim 8, wherein the organic layer further comprises at least one of a hole blocking layer, an electron transport layer, and an electron injection layer.

14. The method of claim 8, wherein the organic layer is formed by one of a laser induced thermal imaging method, a lithography method, and an inkjet method.

* * * * *

UNITED STATES PATENT AND TRADEMARK OFFICE
CERTIFICATE OF CORRECTION

PATENT NO. : 7,659,543 B2  
APPLICATION NO. : 11/274209  
DATED : February 9, 2010  
INVENTOR(S) : Ryu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 545 days.

Signed and Sealed this

Thirtieth Day of November, 2010

David J. Kappos  
*Director of the United States Patent and Trademark Office*